US011463182B2

(12) United States Patent
Athanassiou et al.

(10) Patent No.: US 11,463,182 B2
(45) Date of Patent: Oct. 4, 2022

(54) INTEGRATED CIRCUIT AND METHOD OF PERFORMING A BIST PROCEDURE

(71) Applicant: NXP USA, Inc., Austin, TX (US)

(72) Inventors: Christophe Athanassiou, Saint-Laurent du Var (FR); Jerome Mallet, Bouillargues (FR); Estelle Nguyen, Antibes (FR)

(73) Assignee: NXP USA, Inc., Austin, TX (US)

( * ) Notice: Subject to any disclaimer, the term of this patent is extended or adjusted under 35 U.S.C. 154(b) by 10 days.

(21) Appl. No.: 17/301,723

(22) Filed: Apr. 13, 2021

(65) Prior Publication Data

US 2021/0359773 A1 Nov. 18, 2021

(30) Foreign Application Priority Data

May 13, 2020 (EP) .................................... 20305491

(51) Int. Cl.
| | |
|---|---|
| *H04B 17/00* | (2015.01) |
| *H04B 17/29* | (2015.01) |
| *G01R 31/28* | (2006.01) |
| *H01P 5/16* | (2006.01) |
| *H04B 1/16* | (2006.01) |

(52) U.S. Cl.
CPC ......... *H04B 17/29* (2015.01); *G01R 31/2884* (2013.01); *H01P 5/16* (2013.01); *H04B 1/1638* (2013.01)

(58) Field of Classification Search
CPC ........ H04B 17/29; H04B 1/1638; H04B 1/16; H04B 1/005; H04B 1/0483; H04B 17/00; H04B 1/40; H04B 17/19; G01R 31/2884; G01R 31/3187; H01P 5/16
See application file for complete search history.

(56) References Cited

U.S. PATENT DOCUMENTS

| | | |
|---|---|---|
| 5,787,114 A | 7/1998 | Ramamurthy et al. |
| 5,835,850 A | 11/1998 | Kumar |

(Continued)

FOREIGN PATENT DOCUMENTS

| | | |
|---|---|---|
| JP | H11252026 A | 9/1999 |
| WO | WO2013165542 A1 | 11/2013 |

OTHER PUBLICATIONS

Inac, Ozgur et al., "A Phased Array RFIC With Built-In Self-Test Capabilities", IEEE Transactions On Microwave Theory And Techniques, Jan. 1, 2012, pp. 139-148, vol. 60, No. 1, IEEE, Piscataway, NJ, USA.

*Primary Examiner* — Nhan T Le

(57) ABSTRACT

An integrated circuit and a method of performing a built-in-self-test (BIST) procedure in an integrated circuit. The integrated circuit includes a plurality of radio circuits and a switching network for performing a built-in-self-test (BIST) procedure. The switching network includes a plurality of combiners, a plurality of transmitter connection switches, a combiner switch, a splitter switch, a plurality of splitters and a plurality of receiver connection switches. The switching network may also include a splitter bypass switch and/or a combiner bypass switch. The components of the switching network may operate to route signals between outputs and inputs of the radio circuit to implement the built-in-self-test procedure in one or more modes involving either parallel or sequential testing of the components of the radio circuits. A diagnostic mode is also envisaged.

20 Claims, 7 Drawing Sheets

(56) References Cited

U.S. PATENT DOCUMENTS

| | | | |
|---|---|---|---|
| 7,062,235 B2 * | 6/2006 | Henriksson | H04W 24/06 |
| | | | 455/115.2 |
| 9,031,808 B2 | 5/2015 | Huang et al. | |
| 9,041,421 B2 | 5/2015 | Peng et al. | |
| 9,246,606 B2 * | 1/2016 | Olgaard | H04B 17/29 |
| 9,288,031 B2 * | 3/2016 | Rousu | H04L 5/08 |
| 10,250,339 B2 * | 4/2019 | Sharma | H04B 17/19 |
| 10,284,236 B1 | 5/2019 | Trotta | |
| 2011/0090799 A1 | 4/2011 | El-Hassan et al. | |
| 2013/0122825 A1 | 5/2013 | Deforge et al. | |
| 2014/0169182 A1 | 6/2014 | Olgaard et al. | |
| 2014/0233405 A1 | 8/2014 | Olgaard | |

* cited by examiner

INTEGRATED CIRCUIT AND METHOD OF PERFORMING A BIST PROCEDURE

CROSS-REFERENCE TO RELATED APPLICATIONS

This application claims the priority under 35 U.S.C. § 119 of European Patent application no. 20305491.1, filed on 13 May 2020, the contents of which are incorporated by reference herein.

BACKGROUND

Field

The present specification relates to an integrated circuit and to a method of performing a built-in-self-test (BIST) procedure in an integrated circuit.

Related Art

In a Built-In-Self-Test (BIST) environment for multi-radio transceivers, the most common way to test various Radio Frequency (RF) receivers and transmitters is to use sequential testing. This method consists in testing one radio after the other in a serial way.

In order to speed up the testing time, a parallel testing may be implemented. This method concurrently tests all the receivers with one or more transmitters. The formula (1) shown below may be used to calculate the time gained by using the parallel testing:

$$\text{Total Time}_{parallel\ method} = (\text{Total Time}_{sequential\ method}) / (\text{Number of radios tested}) \quad (1)$$

Accordingly, in formula (1), the total test time for the parallel testing method is given by the total test time of the sequential method divided by the number of tested receivers or transmitters.

To achieve parallel testing, some passive components such as RF combiners/splitters may be integrated. A combiner is able to sum up n signals coming from n sources. A splitter divides an input signal into several outputs, which is suitable for RF radio testing. However, these devices have several drawbacks, especially with high numbers of inputs/outputs:

- Limited bandwidth, preventing the use of out of band interferers, spurs and multiple frequency range measurements.
- High losses, making the RF signal measurement difficult, and requiring RF synthesisers to operate at their maximum limits.
- Low isolation between the channels may impact antenna input impedance and adversely affect the results.
- The use of splitters in parallel testing limits the frequency ranges of the measurements to be made.

In addition to these limitations, some tests cannot be done in parallel with a unique radio.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an integrated circuit comprising:

a plurality of radio circuits, wherein each radio circuit includes:
 a radio circuit input to receive signals from a respective receiver;
 a radio circuit output to output signals to a respective transmitter;
 a switching network for performing a built-in-self-test (BIST) procedure; and
 circuitry for controlling the switching network to perform the BIST procedure, wherein the switching network comprises:
  a plurality of combiners, each combiner having an input and an output;
  a plurality of transmitter connection switches, wherein each transmitter connection switch is operable selectively to couple each radio circuit output to the input of each of the combiners;
  a combiner switch having an input and an output, wherein the input is coupled to the output of each combiner, wherein the combiner switch is operable selectively to output an output signal received from each of the combiners;
  a splitter switch having an input and an output, wherein the input of the splitter switch is coupled to an output of the combiner switch via one or more further switches;
  a plurality of splitters, each splitter having an input and an output, wherein the input of each splitter is coupled to the output of the splitter switch, wherein the splitter switch is operable selectively to output an output signal received from the one or more further switches to one of the splitters; and
  a plurality of receiver connection switches, wherein each receiver connection switch is operable selectively to couple the output of each splitter to one of the radio circuit inputs.

An integrated circuit including the switching network may be used to perform a built-in-self-test (BIST) procedure on multiple radios.

The switching network may including features allowing the BIST procedure to include parallel and/or sequential testing modes.

The switching network may be operable in a parallel testing mode to:
 combine, at one of the combiners, a signal received from multiple radio circuit outputs to produce a combined signal;
 route the combined signal to the splitter switch via the one or more further switches;
 route the combined signal to one of the splitters using the splitter switch;
 route the combined signal in parallel from the splitter to each of the splitter switches; and
 route the combined signal in parallel from each splitter switch to a respective one of the radio circuit inputs.

This parallel testing mode may allow multiple radio circuit inputs to be tested concurrently. This parallel testing mode may allow fast multi-band testing to be achieved. The combiner used in this parallel testing mode may be chosen according to a frequency range of the BIST procedure.

The switching network may further comprise a splitter bypass switch having an input coupled to the output of the combiner switch via the one or more further switches. Each receiver connection switch may further be operable selectively to couple an output of the splitter bypass switch to one of the radio circuit inputs.

The switching network may be operable in a sequential testing mode to:
 combine, at one of the combiners, a signal received from multiple radio circuit outputs to produce a combined signal;
 route the combined signal to the splitter bypass switch via the one or more further switches;

route the combined signal sequentially from the splitter bypass switch to each of the radio circuit inputs via a respective one of the splitter switches.

This sequential testing mode may allow sequential testing of each radio circuit input using a combined (and potentially therefore high power) signal. The combiner used in this sequential testing mode may be chosen according to a frequency range of the BIST procedure.

The switching network may further comprise a combiner bypass switch having an input coupled to an output of each transmitter connection switch. An output of the combiner bypass switch may be coupled to the input of the splitter switch via the one or more further switches.

The switching network may be operable in a parallel testing mode to:

route a signal, received at a combiner switch from a radio circuit output, through the combiner bypass switch to the splitter switch via the one or more further switches;

route the signal to one of the splitters using the splitter switch;

route the signal in parallel from the splitter to each of the splitter switches; and route the signal in parallel from each splitter switch to a respective one of the radio circuit inputs.

This parallel testing mode may allow multiple radio circuit inputs to be tested concurrently, using a signal received from a unique radio circuit output (e.g. in a single frequency band).

The integrated circuit may further comprise a diagnostic output and a diagnostic switch having an input and an output. The output of the diagnostic switch may be coupled to the diagnostic output. The input of the diagnostic switch may be coupled to the output of the combiner switch via the one or more further switches. Alternatively, or in addition, the input of the diagnostic switch may be coupled to the output of the combiner bypass switch via the one or more further switches.

The switching network may be operable in a first diagnostic mode to route a signal, received at a transmitter connection switch from a radio circuit output, through the combiner bypass switch to the diagnostic output via the one or more further switches and the diagnostic switch.

The switching network may be operable in a second diagnostic mode to:

combine, at one of the combiners, a signal received from multiple radio circuit outputs to produce a combined signal; and route the combined signal from the combiner to the diagnostic output via the combiner switch, the one or more further switches and the diagnostic switch.

The switching network may be operable in the second diagnostic mode to:

sequentially combine, at least one other of the combiners, a signal received from multiple radio circuit outputs to produce a combined signal; and sequentially route each combined signal from the at least one other combiner to the diagnostic output via the combiner switch, the one or more further switches and the diagnostic switch.

The first and second diagnostic modes may allow external diagnostic equipment to be coupled to the diagnostic output for assessing the signals produced by the radio circuit outputs. In the first diagnostic mode, the signals from multiple radio circuit outputs may be combined and the combined signal may be assessed by the external diagnostic equipment. In the second diagnostic mode, the signal from each radio circuit output may be assessed sequentially by the external diagnostic equipment.

An output of the combiner bypass switch may be coupled to the input of the splitter bypass switch via the one or more further switches.

The switching network may be operable in a sequential testing mode to:

route a signal, received at a transmitter connection switch from a radio circuit output, to the splitter bypass switch via the combiner bypass switch and the one or more further switches; and route the signal sequentially from the splitter bypass switch to each of the radio circuit inputs via a respective one of the splitter switches.

This testing mode may allow high isolation, high power, wide dynamic frequency range testing to be performed by bypassing the splitter switch and performing the test sequentially. It is envisaged that this test mode may involve sequentially routing a signal received from each radio circuit output to the splitter bypass switch, so that in radio circuit output can be used in the test procedure in sequence. In this way, the test may involving testing each radio circuit output with each radio circuit input in sequence.

The integrated circuit may be a microcontroller.

According to another aspect of the present disclosure, there is provided a multi-radio system comprising an integrated circuit of the kind set out above. The multi-radio system may, for instance, be a telecom system according to any of the LTE, WCDMA, GSM, GPRS, WLAN, Wifi, Bluetooth, or Zigbee standards. The multi-radio system may, for instance, be a RADAR system (e.g. for automotive applications). The multi-radio system may, for instance, be an Internet-of-Things (IoT) system.

According to a further aspect of the present disclosure, there is provided a method of performing a built-in-self-test (BIST) procedure in an integrated circuit of the kind set out above, the method comprising:

combining, at one of the combiners, a signal received from multiple radio circuit outputs to produce a combined signal;

routing the combined signal to the splitter switch via the one or more further switches;

routing the combined signal to one of the splitters using the splitter switch;

routing the combined signal in parallel from the splitter to each of the splitter switches; and routing the combined signal in parallel from each splitter switch to a respective one of the radio circuit inputs.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
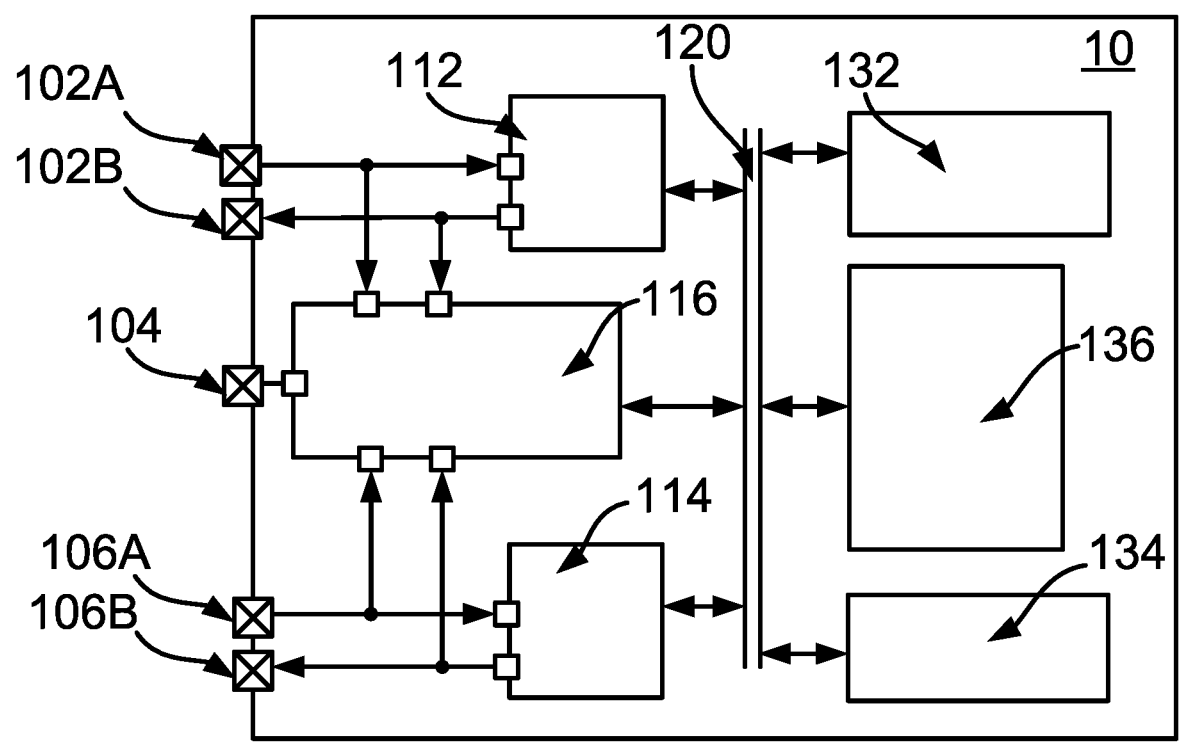
FIG. 1 shows an RF BIST network implementation according to an embodiment of this disclosure.

FIG. 1 shows a schematic of the components of an integrated circuit implementing a radio frequency (RF) built-in-self-test (BIST) network according to an embodiment of this disclosure. IN this embodiment, the integrated circuit comprises a microcontroller unit (MCU), although this is not essential.

The MCU may include a processor core 135 and a number of peripherals 132, 134. The MCU 10 includes a plurality of radio circuits 112, 114. In this embodiment only two radio circuits 112, 114 are shown, but it is envisaged that more than two radio circuits may be present, allowing for easy scalability of the device. Each radio circuit has a radio circuit input and a radio circuit output. In this embodiment a radio circuit output of the radio circuit 112 is coupled to an output 102A of the MCU 10 and a radio circuit input of the radio circuit 112 is coupled to an input 102B of the MCU 10, to allow the radio circuit 112 to send and receive RF signals via an RF transmitter. Similarly, a radio circuit output of the radio circuit 114 is coupled to an output 106A of the MCU 10 and a radio circuit input of the radio circuit 114 is coupled to an input 106B of the MCU 10, to allow the radio circuit 112 to send and receive RF signals via an RF transmitter.

The MCU 10 also includes a switching network 116 for performing a built-in-self-test (BIST) procedure. As shown in FIG. 1, the radio circuit input and the radio circuit output of each radio circuit is coupled to the switching network 116. The MCU 10 may also include a diagnostic interface 104 coupled to the switching network 116, for receiving and/or outputting diagnostic signals.

As shown in FIG. 1, each radio circuit 112, 114, the switching network 116, the processor core 136 and the peripherals 132, 134 may be communicatively coupled together via a bus 120. The processor core 136 may include circuitry for controlling the switching network 116 and the radio circuits 112, 114 to perform the BIST procedure, in one or more operational modes to be described in more detail below.

Figure 2:
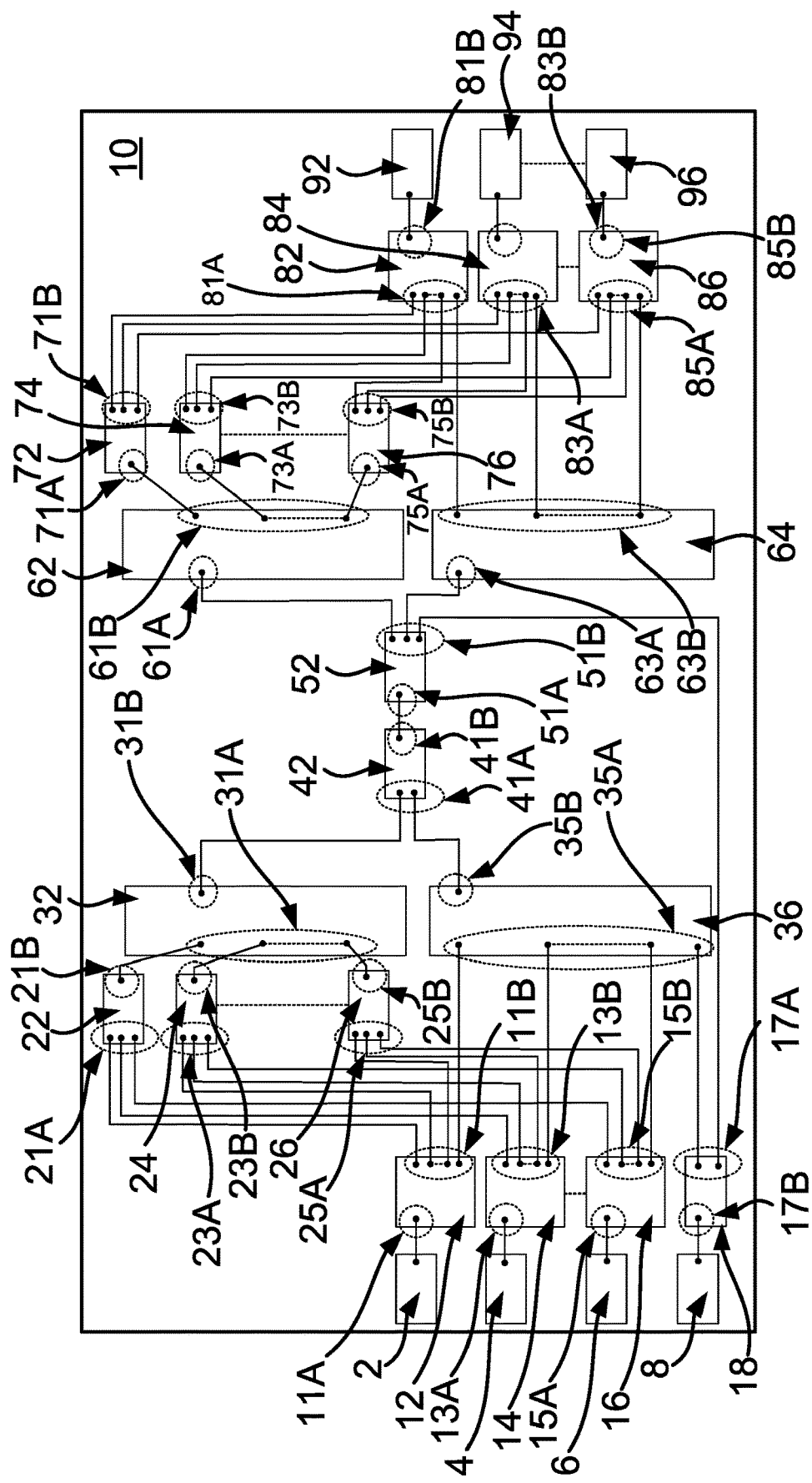
FIG. 2 shows a switching network according to an embodiment of this disclosure.

FIG. 2 shows another schematic of the MCU 10 of FIG. 1, in which the switching network 116 is shown in more detail.

As noted above, integrated circuit may have more than two radio circuits. In the embodiment of FIG. 2 the integrated circuit has three radio circuits, but again it is envisaged that a larger number of radio circuits may be present, allowing for easy scalability of the device. In FIG. 2, the radio circuits and their respective radio circuit outputs are indicated using the reference numerals 2, 4, 6. Similarly, the radio circuits and their respective radio circuit inputs are indicated using the reference numerals 92, 94, 96.

In this embodiment, the switching network 116 includes a plurality of combiners 22, 24, 26. The number of combiners provided in the switching network 116 may be the same as the number of radio circuits. Each combiner 22, 24, 26 has an input and an output. In FIG. 2, the combiner 22 has an input 21A and an output 21B, the combiner 24 has an input 23A and an output 23B, and the combiner 26 has an input 25A and an output 25B.

In this embodiment, the switching network 116 also includes a plurality of transmitter connection switches 12, 14, 16. The number of transmitter connection switches provided in the switching network 116 may be the same as the number of radio circuits. Each transmitter connection switch 12, 14, 16 has an input and an output. In FIG. 2, the transmitter connection switch 12 has an input 11A and an output 11B, the transmitter connection switch 14 has an input 13A and an output 13B, and the transmitter connection switch 16 has an input 15A and an output 15B. The input 11A of the transmitter connection switch 12 may be coupled to the radio circuit output 2, the input 13A of the transmitter connection switch 14 may be coupled to the radio circuit output 4, and the input 15A of the transmitter connection switch 16 may be coupled to the radio circuit output 6. The output 11B of the transmitter connection switch 12 may be coupled to the inputs 21A, 23A, 25A of each of the combiners 22, 24, 26. Similarly, the output 13B of the transmitter connection switch 14 may be coupled to the inputs 21A, 23A, 25A of each of the combiners 22, 24, 26. Similarly, the output 15B of the transmitter connection switch 16 may be coupled to the inputs 21A, 23A, 25A of each of the combiners 22, 24, 26. Note that each output 11B, 13B, 15B shown in FIG. 2 may in some embodiments comprise a plurality of sub-outputs and the inputs 21A, 23A, 25A may similarly comprise a plurality of sub-inputs. For clarity, these sub-outputs and sub-inputs are described herein collectively (and illustrated in FIG. 2 using the dotted ellipses/circles).

The couplings described above can allow the transmitter connection switches 12, 14, 16 selectively to couple each radio circuit output 2, 4, 6 to the input 21A, 23A, 25A of each of the combiners 22, 24, 26. Each combiner 22, 24, 26 may be operable to combine and output each of the signals received from the radio circuit outputs 2, 4, 6 via the transmitter connection switches 12, 14, 16.

In this embodiment, the switching network 116 further includes a combiner switch 32. The combiner switch 32 has an input 31A and an output 31B. The input 31A of the combiner switch 32 is coupled to the output 21B, 23B, 25B of each combiner 22, 24, 26. The combiner switch 32 is operable selectively to output an output signal received from each of the combiners 22, 24, 26 for routing a combined signal through the switching network 116.

Note that the input 31A shown in FIG. 2 may in some embodiments comprise a plurality of sub-inputs (for coupling to each combiner 22, 24, 26, respectively). For clarity, these sub-inputs are described herein collectively (and illustrated in FIG. 2 using the dotted ellipses/circles).

In this embodiment, the switching network 116 also includes a splitter switch 62. The splitter switch 62 has an input 61A and an output 61B. The input 61A is coupled to the output 31B of the combiner switch 32 via one or more further switches 42, 52.

In this embodiment, the switching network 116 further includes a plurality of splitters 72, 74, 76. Each splitter has an input 71A, 73A, 75A and an output 71B, 73B, 75B. The input of each splitter 72, 74, 76 is coupled to the output 61B of the splitter switch 62. The splitter switch 62 may be operable selectively to output an output signal received from the one or more further switches 42, 52 (e.g. a signal routed to the splitter switch 62 from the combiner switch 32 via the one or more further switches 42, 52) to one of the splitters 72, 74, 76.

Note that the output 61B shown in FIG. 2 may in some embodiments comprise a plurality of sub-outputs (for coupling to each splitter 72, 74, 76, respectively). For clarity, these sub-outputs are described herein collectively (and illustrated in FIG. 2 using the dotted ellipses/circles).

In this embodiment, the switching network 116 also includes a plurality of receiver connection switches 82, 84, 86. The receiver connection switch 82 has an input 81A and an output 81B. Similarly, the receiver connection switch 84 has an input 83A and an output 83B. Similarly, the receiver connection switch 86 has an input 85A and an output 85B. The outputs 81B, 83B, 85B are coupled to the radio circuit inputs 92, 94, 96, respectively. Accordingly, each receiver connection switch 82, 84, 86 is operable selectively to couple the output of each splitter 72, 74, 76 to one of the radio circuit inputs 92, 94, 96.

Note that the outputs 71B, 73B, 75B shown in FIG. 2 may in some embodiments comprise a plurality of sub-outputs (for coupling to each receiver connection switch 82, 84, 86, respectively). Similarly, each input 81A, 83A, 85A may in some embodiments comprise a plurality of sub-inputs (for coupling to each splitter 72, 74, 76, respectively). For clarity, these sub-outputs and sub-inputs are described herein collectively (and illustrated in FIG. 2 using the dotted ellipses/circles).

The features of the switching network 116 described above can allow the switching network 116 to operate in the parallel testing mode to be described below in relation to FIG. 3.

In some embodiments, the switching network 116 may further include a splitter bypass switch 64. The splitter bypass switch 64 can allow the splitter switch 62 and the splitters 72, 74, 76 to be bypassed in some operational modes. The one or more further switches 42, 52 may be operable in those operational modes to route received signals to the splitter bypass switch 64 instead of the splitter switch 62.

The splitter bypass switch 64 has an input 63A and an output 63B. The input 63A is coupled to the output 31B of the combiner switch 32 via the one or more further switches 42, 52. The input 63A may also be coupled to the combiner bypass switch 36 (to be described below) via the one or more further switches 42, 52. The output 63B is coupled to the input of each receiver connection switch 82, 84, 86. This can allow each receiver connection switch 82, 84, 86 selectively to couple an output of the splitter bypass switch 64 to one of the radio circuit inputs.

Note that the output 63B shown in FIG. 2 may in some embodiments comprise a plurality of sub-outputs (for coupling to each receiver connection switch 82, 84, 86, respectively). Similarly, each input 81A, 83A, 85A may in some embodiments include a respective sub-input for coupling to the splitter bypass switch 64. For clarity, these sub-outputs and sub-inputs are described herein collectively (and illustrated in FIG. 2 using the dotted ellipses/circles).

The features of the switching network 116 including the splitter bypass switch 64 described above can allow the switching network 116 to operate in the sequential testing mode mode to be described below in relation to FIG. 4.

In some embodiments, the switching network 116 may further include a combiner bypass switch 36. The combiner bypass switch 36 may allow the combiners 22, 24, 26 and the combiner switch 32 to be bypassed in some operational modes of the switching network 116. Instead, in those operational modes, the signals received from the radio circuit outputs 2, 4, 6 may be routed through the switching network 116 via the combiner bypass switch 36.

The combiner bypass switch 36 has an input 35A and an output 35B. The input 35A of the combiner bypass switch 36 is coupled to the output 11B, 13B, 15B of each transmitter connection switch 12, 14, 16. The output 35B of the combiner bypass switch 36 is coupled to the input 61A of the splitter switch 62 and or coupled to the input 63A of the splitter bypass switch 64 via the one or more further switches 42, 52.

Note that the input 35A shown in FIG. 2 may in some embodiments comprise a plurality of sub-inputs (for coupling to each transmitter connection switch 12, 14, 16, respectively). Similarly, each output 11B, 13B, 15B may in some embodiments include a respective sub-output for coupling to the combiner bypass switch 36. For clarity, these sub-outputs and sub-inputs are described herein collectively (and illustrated in FIG. 2 using the dotted ellipses/circles).

The features of the switching network 116 including the combiner bypass switch 36 described above can allow the switching network 116 to operate in the parallel testing mode to be described below in relation to FIG. 5.

In some embodiments, the switching network 116 may further include a diagnostic output 8. The diagnostic output 8 may be coupled to the a diagnostic interface 104 described above in relation to FIG. 1. In these embodiments, the switching network 116 may also include a diagnostic switch 18. The diagnostic switch 18 has an input 17A and an output 17B. The output 17B of the diagnostic switch 18 is coupled to the diagnostic output 8. The input 17A of the diagnostic switch 18 may be coupled to the output 31B of the combiner switch 32 via the one or more further switches 42, 52 to allow the diagnostic switch 18 to receive a combined signal from one or more of the combiners 22, 24, 26 and route it to the diagnostic output 8. The input 17A of the diagnostic switch 18 may alternatively (or additionally) be coupled to the output 35B of the combiner bypass switch 36 via the one or more further switches 42, 52 so as to allow the diagnostic switch 18 to route an uncombined signal from one or more of the radio circuit outputs 2, 4, 6 to the diagnostic output 8.

The features of the switching network 116 including the combiner bypass switch 36, the diagnostic output 8 and the diagnostic switch 18 described above can allow the switching network to operate in the first and/or second diagnostic modes to be described below in relation to FIG. 6.

As noted above, in some embodiments, the output 35B of the combiner bypass switch 36 may be coupled to the input 63A of the splitter bypass switch 64 via the one or more further switches 42, 52. This can allow the switching network 116 to operate in the sequential testing mode to be described below in relation to FIG. 7.

The one or more further switches noted above may take any suitable form for providing the appropriate couplings between the various components of the switching network 116 described above, for operation of the switching network 116 in one or more operational modes to be described below.

In the embodiment shown in FIG. 2, a first further switch 42 and a second further switch 52 are provided. The first further switch 42 includes an input 41A and an output 41B. The second further switch 52 includes an input 51A and an output 51B. The input 41A of the first further switch 42 may be coupled to the output 31B of the combiner switch 32. The input 41A of the first further switch 42 may be coupled to the output 35B of the combiner bypass switch 36. The output 41B of the first further switch 42 is coupled to the input 51A of the second further switch 52. The output 51B of the second further switch 52 may be coupled to the input 61A of the splitter switch 62. The output 51B of the second further switch 52 may be coupled to the input 62A of the splitter bypass switch 64. The output 51B of the second further switch 52 may be coupled to the input 17A of the diagnostic switch 18.

The arrangement of couplings of the first and second switches can, as will be described below, allow appropriate routing of signals through the switching network 116 in the one or more operational modes of the switching network 116.

A number of operational modes of the switching network 116 will now be described with reference to FIGS. 3 to 7. As will be appreciated from the description of FIGS. 3 to 7, an integrated circuit according to embodiments of this disclosure may be operable in a plurality of parallel and sequential testing modes and may also be operable in a diagnostic mode. The various switches and other components of the switching network may be controlled by the processor core 136 described above in relation to FIG. 1.

In each operational mode for the BIST procedure (with the exception of the diagnostic modes), the radio circuits of the integrated circuit may each produce a test signal, which is routed to the switching network 116 via the radio circuit outputs 2, 4, 6. The test signals may be routed through the various components of the switching network 116 to the radio circuit inputs 92, 94, 96. The test signals received at the radio circuit inputs 92, 94, 96 may then be evaluated. The diagnostic modes, the radio circuits of the integrated circuit may again each produce a test signal, which is routed to the switching network 116 via the radio circuit outputs 2, 4, 6. The test signals may then be routed through the various components of the switching network 116 to the diagnostic output 8 for evaluation by external diagnostic equipment.

Figure 3:
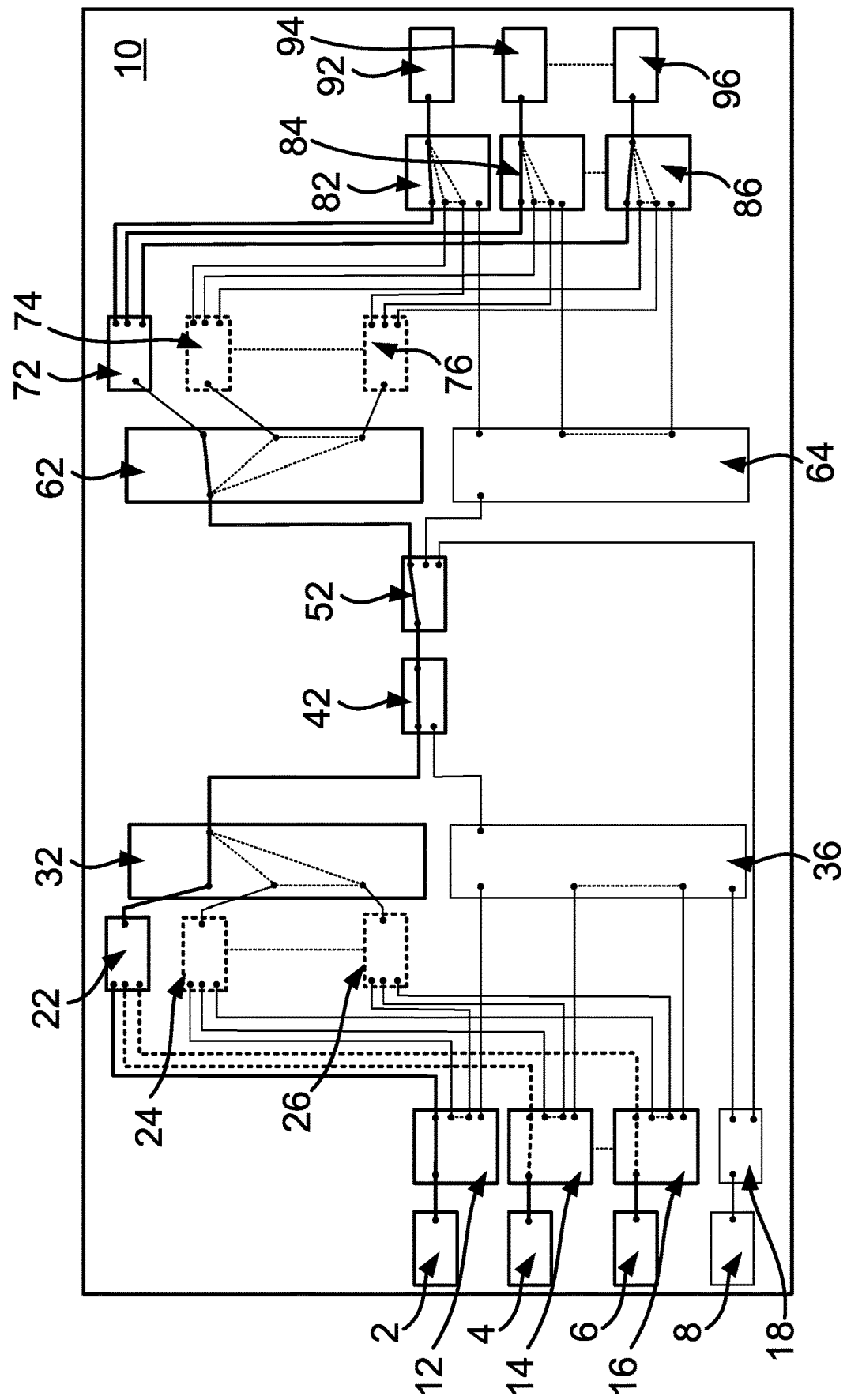
FIG. 3 shows an example of the operation of the switching network of FIG. 2.

In FIG. 3, a parallel testing mode of the switching network 116 is shown. In this mode, the switching network 116 is operable combine, at one of the combiners 22, 24, 26, a test signal received from multiple radio circuit outputs to produce a combined signal. The combiner 22, 24, 26 to be used may be chosen according to factors such as the useful frequency range of each combiner 22, 24, 26 and the anticipated frequency range of the signals to be combined. By diversifying the useful frequency ranges of the combiners 22, 24, 26, increased flexibility may be provided in the BIST procedure. As shown in FIG. 2, the transmitter connection switches 12, 14 16 may be controlled by the processor core 136 to route the test signals from the radio circuit outputs 2, 4, 6 to chosen combiner (in the embodiment of FIG. 3, the combiner 22 is chosen).

The chosen combiner 22, 24, 26 may combine the signals from at least two of the radio circuit outputs 2, 4, 6 to produce the combined signal. In some embodiments, such as the one shown in FIG. 3, the combined signal may comprise a combined signal from all of the radio circuit outputs 2, 4, 6.

As shown in FIG. 3, the combined signal is then routed through the combiner switch 32 (which may be controlled by the processor core 136 to select at its input 31A the output 21B of the chosen combiner 22) and the one or more further switches 42, 52 to the splitter switch 62. The splitter switch 62 (again under the control of the processor core 136) may then route the combined signal to one of the splitters 72, 74, 76. As with the combiner selection noted above, the splitter 72, 74, 76 to be used may be chosen according to factors such as the useful frequency range of each splitter 72, 74, 76 and the anticipated frequency range of the combined signal. Typically, the chosen splitter 72, 74, 76 would have the same useful frequency range as the chosen combiner 22, 24, 26. Again, by diversifying the useful frequency ranges of the splitters 72, 74, 76, increased flexibility may be provided in the BIST procedure.

The chosen splitter (the splitter 72 in the example of FIG. 3) may then route the combined signal in parallel from to each of the splitter switches 82, 84, 86. Each splitter switch 82, 84, 86 may then route the combined signal to a respective one of the radio circuit inputs 92, 94, 96.

This operational mode can allow receive tests to be performed in parallel in a selected frequency band. The power of the test signal may be increased by combining the signals from multiple radio circuit outputs 2, 4, 6, for concurrent reception at each radio circuit input 92, 94, 96. In some embodiments, the BIST procedure may, after the steps described above, switch to a next combiner/splitter pair, to perform parallel receiver testing in a different frequency band. The use of the combiner switch 32 and the splitter switch 62 can thus allow for convenient, fast, multi-band testing by appropriate selection of the combiner and splitter pair to be used.

Figure 4:
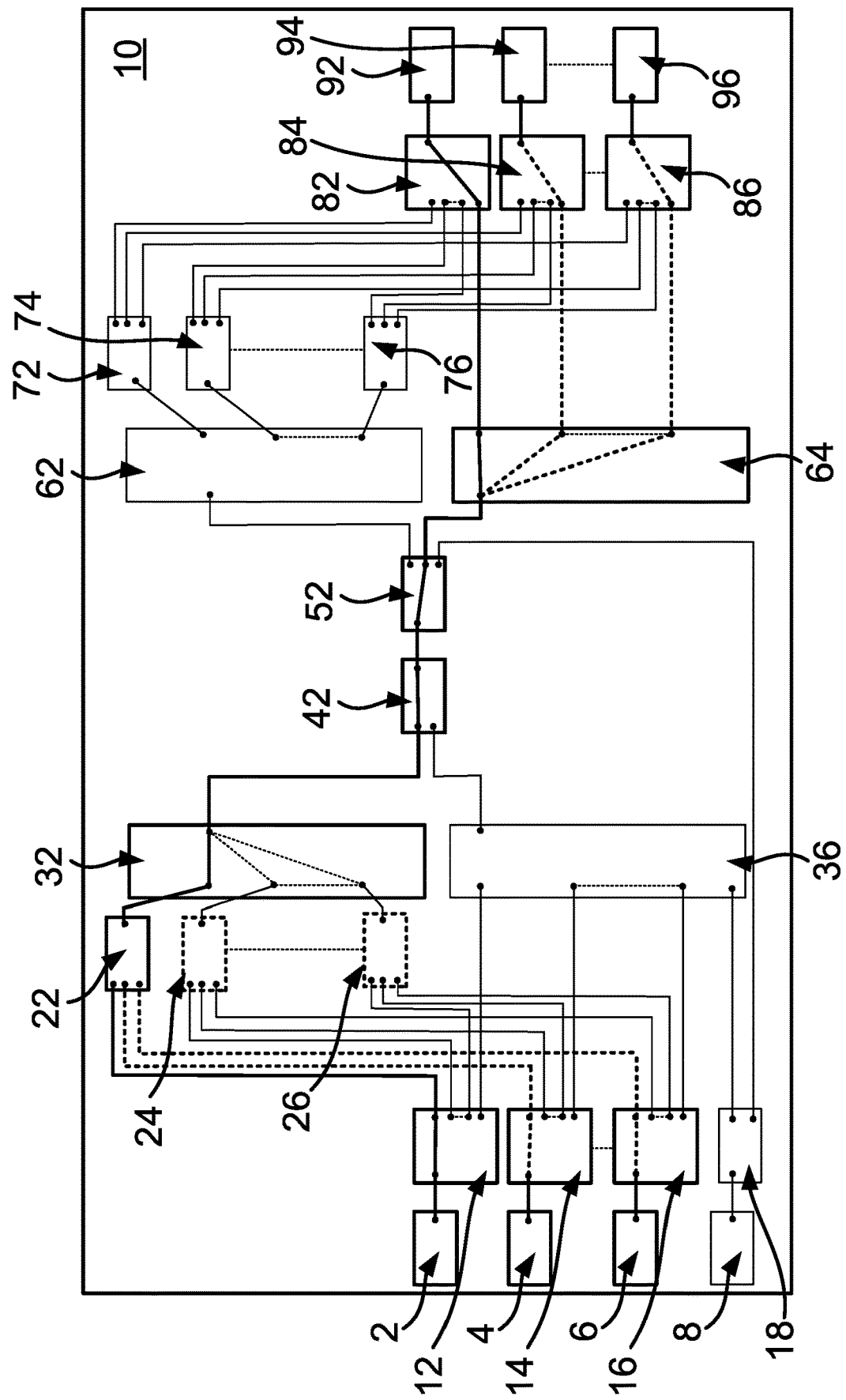
FIG. 4 shows an example of the operation of the switching network of FIG. 3.

In FIG. 4, a sequential testing mode of the switching network 116 is shown. In this mode, the operation of the transmitter connection switches 12, 14, 16, the combiners 22, 24, 26 and the combiner switch 32 is similar to that described above in relation to FIG. 3. However, in this mode, the one or more further switches 42, 52 route the combined signal to the splitter bypass switch 64 instead of the splitter switch 62. The splitters 72, 74, 76 are thereby bypassed in this mode.

The splitter bypass switch 64 then routes the combined signal sequentially to each of the radio circuit inputs 92, 94, 96 via a respective one of the splitter switches 82, 84, 86.

This operation mode can allow the use of combined signals in a specific frequency band (depending on the combiner chosen) to perform high power range serial receiver testing at the radio circuit inputs 92, 94, 96. By routing the combined signal to each radio circuit input 92, 94, 96 in a sequence (instead of concurrently) potential isolation issues between the radio circuit inputs 92, 94, 96 may be avoided.

Figure 5:
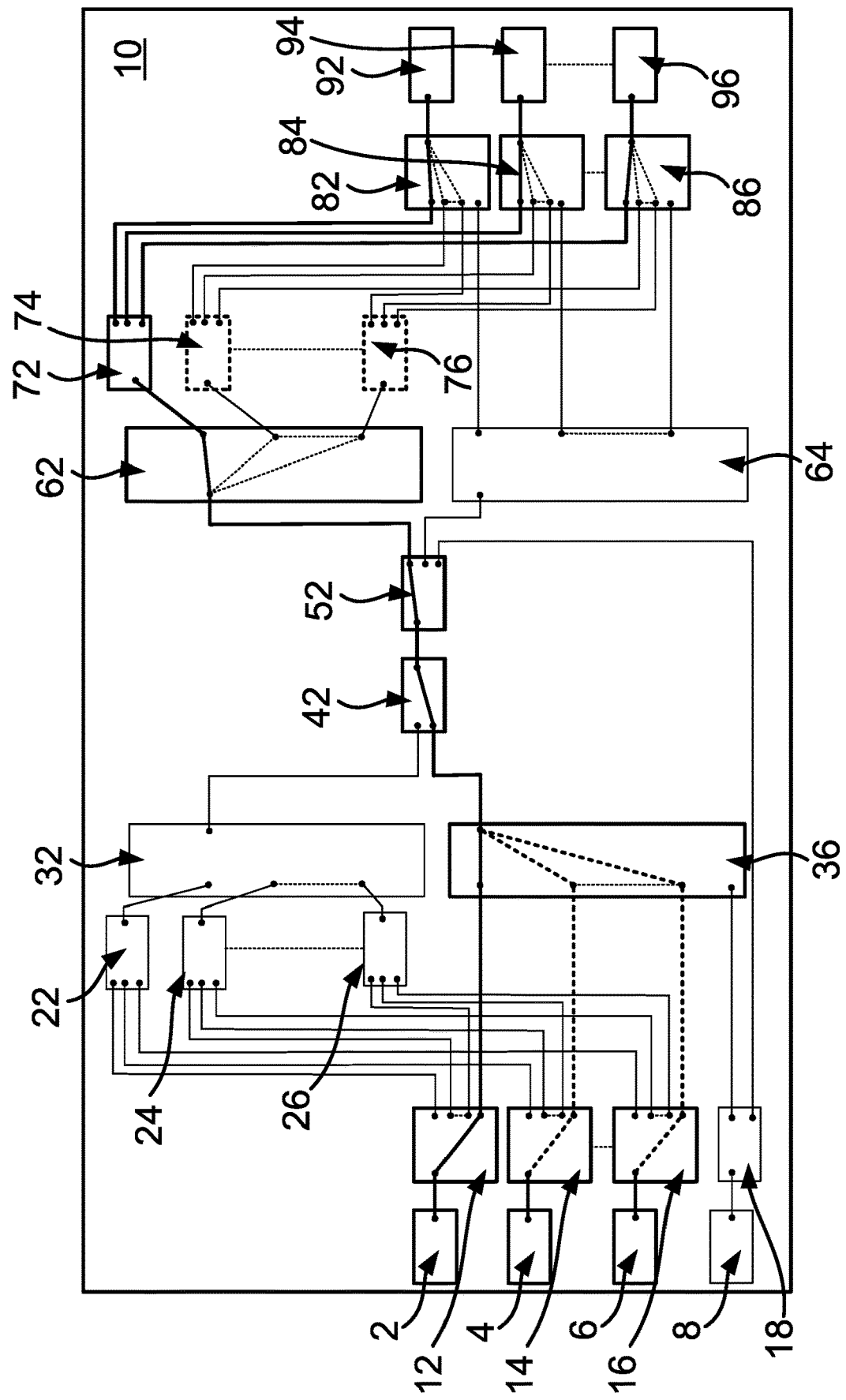
FIG. 5 shows an example of the operation of the switching network of FIG. 4.

In FIG. 5, a parallel testing mode of the switching network 116 is shown. In this mode, the switching network 116 (e.g. under the control of the core processor 134) routes a test signal, received at a combiner switch 12, 14, 16 from a chosen radio circuit output 2, 4, 6 (the combiner switch 12 and the radio circuit output 2 are chosen in the embodiment shown in FIG. 5), through the combiner bypass switch 36 to the splitter switch 62 via the one or more further switches 42, 52. The splitter switch 62 then routes the signal to one of the splitters 72, 74, 76 (the splitter 72 is chosen in the embodiment shown in FIG. 5). The chosen splitter 72 then routes the signal in parallel to each of the splitter switches 82, 84, 86. Each splitter switch then routes the signal to a respective one of the radio circuit inputs 92, 94, 96.

This configuration enables the testing of several receivers (radio circuit inputs) concurrently with a test signal received from a unique radio circuit output. As shown in FIG. 5, the switching network may subsequently switch to using a different radio circuit output once testing in a specific frequency band using a previous radio circuit output has been completed. In this way, more than one specific frequency band can be used in the BIST procedure.

This operational mode can allow testing in one of more specific frequency bands. As described above, the splitter to be used may be chosen according to the useful frequency range of the splitter 72, 74, 76. The dynamic power range in this test mode may be higher than in modes using full parallel testing. This operational mode can allow performance of fast, higher power range testing with a unique input signal on one frequency band.

Figure 6:
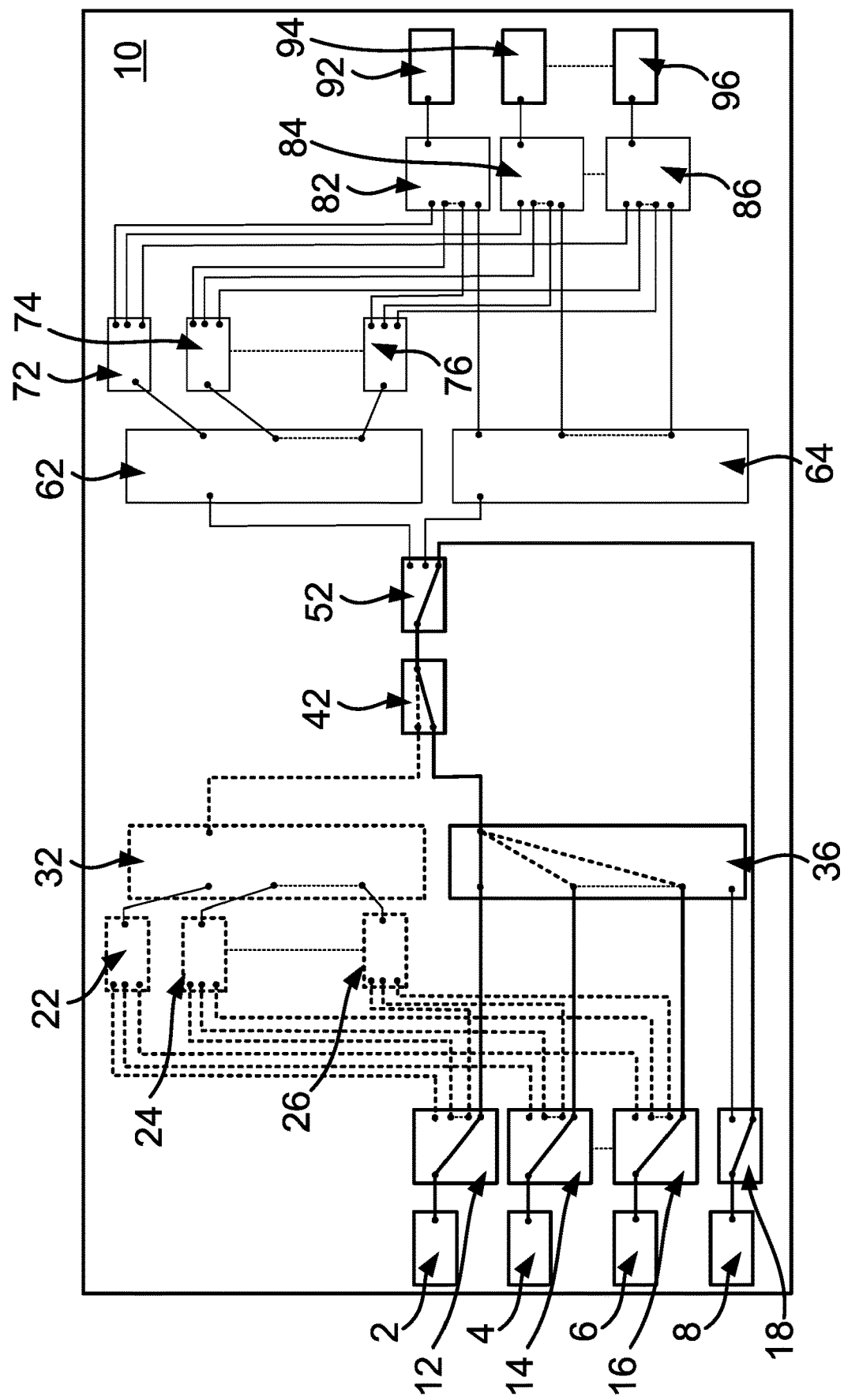
FIG. 6 shows an example of the operation of the switching network of FIG. 5.

In FIG. 6, first and second diagnostic testing modes of the switching network 116 are shown. The two diagnostic modes each make use of the diagnostic output 8 to allow test signals produced by the radio circuit outputs 2, 4, 6 to be evaluated by external diagnostic equipment.

In the first diagnostic testing mode, the switching network 116 (e.g. under control of the core processor 134) routes a test signal, received at a transmitter connection switch 12, 14, 16 from a radio circuit output 2, 4, 6, through the combiner bypass switch 36 to the diagnostic output 8 via the one or more further switches 42, 52 and the diagnostic switch 18. As illustrated in FIG. 6, once the test signal from one of the radio circuit outputs 2, 4, 6 has been evaluated by the external diagnostic equipment, the switching network 116 may move on to routing a test signal received at a next transmitter connection switch 12, 14, 16 from a next radio circuit output 2, 4, 6 and so on. In this way, each radio circuit output can be evaluated/tested individually by the external diagnostic equipment.

In addition to, or instead of the sequential, individual evaluation of the test signals from the radio circuit outputs 2, 4, 6 in the first diagnostic mode noted above, the switching network 116 (e.g. under control of the core processor 134) may be operable in a second diagnostic mode to combine the test signals from multiple radio circuit outputs 2, 4, 6 into a combined signal for evaluation by the external diagnostic equipment. To do so, in the second diagnostic mode, the switching network 116 may use the transmitter connection switches 12, 14, 16 to route test signals from their respective radio circuit outputs 2, 4, 6, to one of the combiners 22, 24, 26. As before, the combiner 22, 24, 26 to be used may be chosen based on the useful frequency ranges of the combiners 22, 24, 26 and the anticipated frequency range of the combined test signal.

In the second diagnostic mode, the chosen combiner may combine the tests signals received from the multiple radio circuit outputs 2, 4, 6 to produce the combined signal, and the switching network 116 may then route the combined signal from the chosen combiner 2, 4, 6 to the diagnostic output 8 via the combiner switch 32, the one or more further switches 42, 52 and the diagnostic switch 18. Where it is desired to externally evaluate combined test signals in a plurality of frequency bands, the second diagnostic mode may further involve moving onto a next one of the combiners 22, 24, 26 after the first chosen combiner 22, 24, 26 has been used. Thus, the switching network 116 may sequentially combine, at least one other of the combiners 22, 24, 26, a signal received from multiple radio circuit outputs 2, 4, 6 to produce a next combined signal, and may sequentially route each combined signal from the at least one other combiner 22, 24, 26 to the diagnostic output 8 via the combiner switch 32, the one or more further switches 42, 52 and the diagnostic switch 18.

The first and second diagnostic modes can thus allow the integrity of the test signal to be evaluated externally by routing them back to the diagnostic output 8. This can allow extra, external measurements to be performed. The diagnostic modes may be used to perform regression tests or to validate the radio circuit outputs 2, 4, 6 and their test signals before using them for validation of the radio circuit inputs 92, 94, 96. In the diagnostic modes, the test signals can be evaluated individually (in a sequence) or in parallel (by combining them).

Figure 7:
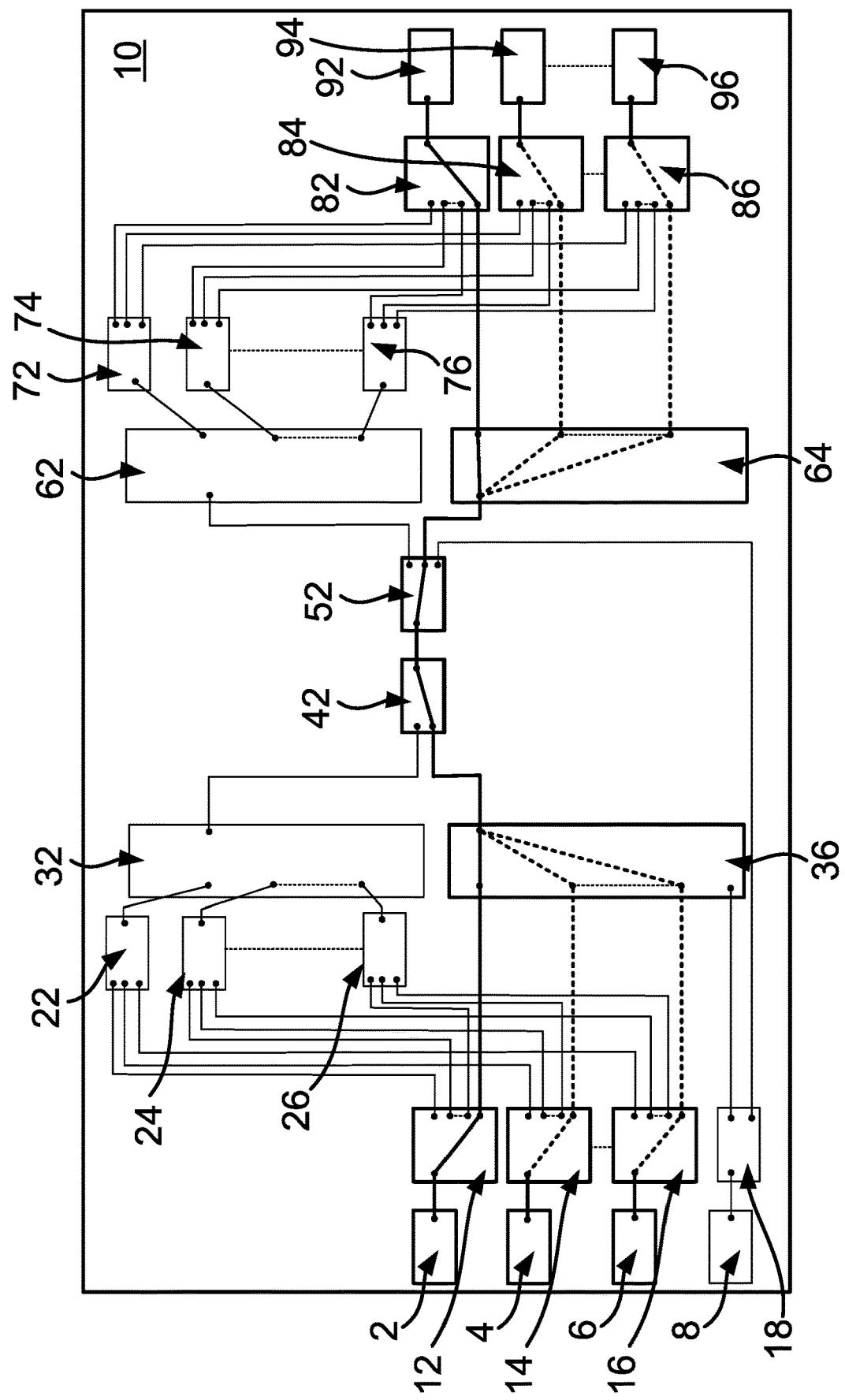
FIG. 7 shows an example of the operation of the switching network of FIG. 6.

In FIG. 7, a sequential testing mode of the switching network 116 is shown. In this mode, the switching network 116 (e.g. under the control of the core processor 134) routes a test signal received at a transmitter connection switch 12, 14, 16 from a chosen radio circuit output 2, 4, 6, to the splitter bypass switch 64 via the combiner bypass switch 36 and the one or more further switches 42, 53. The combiners 22, 24, 26 and the splitters 72, 74, 76 are thereby bypassed in this mode.

The splitter bypass switch 64 then routes the test signal sequentially to each of the radio circuit inputs 92, 94, 96 via a respective one of the splitter switches 82, 84, 86.

The radio circuit output to be used may be chosen again according to the desired power and/or frequency range. In the embodiment shown in FIG. 7, the radio circuit output 2 and its associated transmitter connection switch are chosen. As illustrated in FIG. 2, once the chosen radio circuit output has be used with each radio circuit input 92, 94, 96, the BIST procedure may move on to another radio circuit output and transmitter connection switch pair, e.g. to test at a different frequency range. In this way, each radio circuit output 92, 94, 96 can be tested individually with each radio circuit input 2, 4, 6 in an extended sequence.

This sequential testing operational mode is suitable for wideband transmit measurements and high input power level receive tests. This mode uses switches, so the losses may be relatively low and the frequency range and paths isolations may be higher compared to modes in which a splitter is used. Hence higher dynamic range measurements may be achieved. The test signals may thereby be used in a more efficient way by taking advantage of the factors noted above. For instance, wideband Internet of Things (IoT) tests can be handled more easily with higher power levels and a higher bandwidth. The test coverage may thereby be increased.

Accordingly, there has been described an integrated circuit and a method of performing a built-in-self-test (BIST) procedure in an integrated circuit. The integrated circuit includes a plurality of radio circuits and a switching network for performing a built-in-self-test (BIST) procedure. The switching network includes a plurality of combiners, a plurality of transmitter connection switches, a combiner switch, a splitter switch, a plurality of splitters and a plurality of receiver connection switches. The switching network may also include a splitter bypass switch and/or a combiner bypass switch. The components of the switching network may operate to route signals between outputs and inputs of the radio circuit to implement the built-in-self-test procedure in one or more modes involving either parallel or sequential testing of the components of the radio circuits. A diagnostic mode is also envisaged.

Although particular embodiments of this disclosure have been described, it will be appreciated that many modifications/additions and/or substitutions may be made within the scope of the claims.

The invention claimed is:

1. An integrated circuit comprising:
   a plurality of radio circuits, wherein each radio circuit includes:
      a radio circuit input to receive signals from a respective receiver;
      a radio circuit output to output signals to a respective transmitter;
   a switching network for performing a built-in-self-test (BIST) procedure; and
   circuitry for controlling the switching network to perform said BIST procedure, wherein the switching network comprises:
      a plurality of combiners, each combiner having an input and an output;
      a plurality of transmitter connection switches, wherein each transmitter connection switch is operable selectively to couple each radio circuit output to the input of each of said combiners;

a combiner switch having an input and an output, wherein the input is coupled to the output of each combiner, wherein the combiner switch is operable selectively to output an output signal received from each of said combiners;

a splitter switch having an input and an output, wherein the input of the splitter switch is coupled to an output of the combiner switch via one or more further switches;

a plurality of splitters, each splitter having an input and an output, wherein the input of each splitter is coupled to the output of the splitter switch, wherein the splitter switch is operable selectively to output an output signal received from the one or more further switches to one of said splitters; and a plurality of receiver connection switches, wherein each receiver connection switch is operable selectively to couple the output of each splitter to one of said radio circuit inputs.

2. The integrated circuit of claim 1, wherein the switching network is operable in a parallel testing mode to:

combine, at one of the combiners, a signal received from multiple radio circuit outputs to produce a combined signal;

route the combined signal to the splitter switch via the one or more further switches;

route the combined signal to one of the splitters using the splitter switch;

route the combined signal in parallel from said splitter to each of the splitter switches; and route the combined signal in parallel from each splitter switch to a respective one of the radio circuit inputs.

3. The integrated circuit of claim 1, wherein the switching network further comprises a splitter bypass switch having an input coupled to the output of the combiner switch via said one or more further switches, wherein each receiver connection switch is further operable selectively to couple an output of the splitter bypass switch to one of said radio circuit inputs.

4. The integrated circuit of claim 3, wherein the switching network is operable in a sequential testing mode to:

combine, at one of the combiners, a signal received from multiple radio circuit outputs to produce a combined signal;

route the combined signal to the splitter bypass switch via the one or more further switches;

route the combined signal sequentially from the splitter bypass switch to each of the radio circuit inputs via a respective one of the splitter switches.

5. The integrated circuit of claim 1, wherein the switching network further comprises a combiner bypass switch having an input coupled to an output of each transmitter connection switch, wherein an output of the combiner bypass switch is coupled to the input of the splitter switch via said one or more further switches.

6. The integrated circuit of claim 5, wherein the switching network is operable in a parallel testing mode to:

route a signal, received at a combiner switch from a radio circuit output, through the combiner bypass switch to the splitter switch via the one or more further switches;

route the signal to one of the splitters using the splitter switch;

route the signal in parallel from said splitter to each of the splitter switches; and route the signal in parallel from each splitter switch to a respective one of the radio circuit inputs.

7. The integrated circuit of claim 5, further comprising:
a diagnostic output; and
a diagnostic switch having an input and an output,
wherein the output of the diagnostic switch is coupled to the diagnostic output, and
wherein the input of the diagnostic switch is coupled to:
the output of the combiner switch via the one or more further switches; and/or
the output of the combiner bypass switch via the one or more further switches.

8. The integrated circuit of claim 7, wherein the switching network is operable in a first diagnostic mode to:

route a signal, received at a transmitter connection switch from a radio circuit output, through the combiner bypass switch to the diagnostic output via the one or more further switches and the diagnostic switch.

9. The integrated circuit of claim 7, wherein the switching network is operable in a second diagnostic mode to:

combine, at one of the combiners, a signal received from multiple radio circuit outputs to produce a combined signal; and route the combined signal from the combiner to the diagnostic output via the combiner switch, the one or more further switches and the diagnostic switch.

10. The integrated circuit of claim 9, wherein the switching network is operable in the second diagnostic mode to:

sequentially combine, at at least one other of the combiners, a signal received from multiple radio circuit outputs to produce a combined signal; and sequentially route each combined signal from the at least one other combiner to the diagnostic output via the combiner switch, the one or more further switches and the diagnostic switch.

11. The integrated circuit of any of claim 5, wherein an output of the combiner bypass switch is coupled to the input of the splitter bypass switch via said one or more further switches.

12. The integrated circuit of claim 11, wherein the switching network is operable in a sequential testing mode to:

route a signal, received at a transmitter connection switch from a radio circuit output, to the splitter bypass switch via the combiner bypass switch and the one or more further switches; and route the signal sequentially from the splitter bypass switch to each of the radio circuit inputs via a respective one of the splitter switches.

13. The integrated circuit of claim 1, wherein the integrated circuit is a microcontroller.

14. A multi-radio system comprising:
a plurality of radio circuits, wherein each radio circuit includes:
a radio circuit input to receive signals from a respective receiver;
a radio circuit output to output signals to a respective transmitter;
a switching network for performing a built-in-self-test (BIST) procedure; and
circuitry for controlling the switching network to perform said BIST procedure, wherein the switching network comprises:
a plurality of combiners, each combiner having an input and an output;
a plurality of transmitter connection switches, wherein each transmitter connection switch is operable selectively to couple each radio circuit output to the input of each of said combiners;
a combiner switch having an input and an output, wherein the input is coupled to the output of each combiner, wherein the combiner switch is operable selectively to output an output signal received from each of said combiners;
a splitter switch having an input and an output, wherein the input of the splitter switch is coupled to an output of the combiner switch via one or more further switches;
a plurality of splitters, each splitter having an input and an output, wherein the input of each splitter is coupled to the output of the splitter switch, wherein the splitter switch is operable selectively to output an output signal received from the one or more further switches to one of said splitters; and
a plurality of receiver connection switches, wherein each receiver connection switch is operable selectively to couple the output of each splitter to one of said radio circuit inputs.

15. The multi-radio system of claim 14, wherein the switching network is operable in a parallel testing mode to:
combine, at one of the combiners, a signal received from multiple radio circuit outputs to produce a combined signal;
route the combined signal to the splitter switch via the one or more further switches;
route the combined signal to one of the splitters using the splitter switch;
route the combined signal in parallel from said splitter to each of the splitter switches; and
route the combined signal in parallel from each splitter switch to a respective one of the radio circuit inputs.

16. The multi-radio system of claim 14, wherein the switching network further comprises a splitter bypass switch having an input coupled to the output of the combiner switch via said one or more further switches, wherein each receiver connection switch is further operable selectively to couple an output of the splitter bypass switch to one of said radio circuit inputs.

17. The multi-radio system of claim 16, wherein the switching network is operable in a sequential testing mode to:
combine, at one of the combiners, a signal received from multiple radio circuit outputs to produce a combined signal;
route the combined signal to the splitter bypass switch via the one or more further switches;
route the combined signal sequentially from the splitter bypass switch to each of the radio circuit inputs via a respective one of the splitter switches.

18. The multi-radio system of claim 14, wherein the switching network further comprises a combiner bypass switch having an input coupled to an output of each transmitter connection switch, wherein an output of the combiner bypass switch is coupled to the input of the splitter switch via said one or more further switches.

19. The multi-radio system of claim 18, wherein the switching network is operable in a parallel testing mode to:
route a signal, received at a combiner switch from a radio circuit output, through the combiner bypass switch to the splitter switch via the one or more further switches;
route the signal to one of the splitters using the splitter switch;
route the signal in parallel from said splitter to each of the splitter switches; and
route the signal in parallel from each splitter switch to a respective one of the radio circuit inputs.

20. A method of performing a built-in-self-test (BIST) procedure in an integrated circuit the integrated circuit comprising:
a plurality of radio circuits, wherein each radio circuit includes:
a radio circuit input to receive signals from a respective receiver;
a radio circuit output to output signals to a respective transmitter;
a switching network for performing a built-in-self-test (BIST) procedure; and
circuitry for controlling the switching network to perform said BIST procedure, wherein the switching network comprises:
a plurality of combiners, each combiner having an input and an output;
a plurality of transmitter connection switches, wherein each transmitter connection switch is operable selectively to couple each radio circuit output to the input of each of said combiners;
a combiner switch having an input and an output, wherein the input is coupled to the output of each combiner, wherein the combiner switch is operable selectively to output an output signal received from each of said combiners;
a splitter switch having an input and an output, wherein the input of the splitter switch is coupled to an output of the combiner switch via one or more further switches;
a plurality of splitters, each splitter having an input and an output, wherein the input of each splitter is coupled to the output of the splitter switch, wherein the splitter switch is operable selectively to output an output signal received from the one or more further switches to one of said splitters; and
a plurality of receiver connection switches, wherein each receiver connection switch is operable selectively to couple the output of each splitter to one of said radio circuit inputs,
the method comprising:
combining, at one of the combiners, a signal received from multiple radio circuit outputs to produce a combined signal;
routing the combined signal to the splitter switch via the one or more further switches;
routing the combined signal to one of the splitters using the splitter switch;
routing the combined signal in parallel from said splitter to each of the splitter switches; and
routing the combined signal in parallel from each splitter switch to a respective one of the radio circuit inputs.

* * * * *